United States Patent [19]

Wanderman et al.

[11] Patent Number: 4,954,455
[45] Date of Patent: Sep. 4, 1990

[54] SEMICONDUCTOR MEMORY DEVICE HAVING PROTECTION AGAINST ALPHA STRIKE INDUCED ERRORS

[75] Inventors: Drew Wanderman, Palo Alto; Matthew Weinberg, Mountain View, both of Calif.

[73] Assignee: Advanced Micro Devices, Sunnyvale, Calif.

[21] Appl. No.: 259,472

[22] Filed: Oct. 18, 1988

Related U.S. Application Data

[63] Continuation of Ser. No. 211,179, Jun. 24, 1988, abandoned, which is a continuation of Ser. No. 683,288, Dec. 18, 1984, abandoned.

[51] Int. Cl.$^5$ ............................................. H01L 21/331
[52] U.S. Cl. ........................................ 437/31; 437/52; 437/225
[58] Field of Search ................... 437/31, 32, 33, 51, 437/52, 225; 357/34, 44; 148/DIG. 10, DIG. 11, DIG. 51

[56] References Cited

U.S. PATENT DOCUMENTS

| | | |
|---|---|---|
| 3,551,220 | 12/1970 | Meer et al. |
| 3,669,760 | 6/1972 | Rein |
| 3,926,695 | 12/1975 | U |
| 3,970,487 | 7/1976 | Dahmen et al. ............ 148/DIG. 51 |
| 4,314,359 | 2/1982 | Kato et al. ..................... 365/179 |
| 4,376,983 | 3/1983 | Tsaur et al. ...................... 365/53 |
| 4,435,898 | 3/1984 | Gaur et al. |
| 4,492,008 | 1/1989 | Anantha |
| 4,516,316 | 3/1985 | Haskell |

FOREIGN PATENT DOCUMENTS

| | | |
|---|---|---|
| 0037930 | 3/1981 | European Pat. Off. |
| 57-196563 | 2/1982 | Japan |
| 0154779 | 7/1987 | Japan ............................ 357/43 |

OTHER PUBLICATIONS

Maheaux, "Transistor . . . ", IBM TDB vol. 11, #12, May '69, pp. 1690-1691.

Primary Examiner—Olik Chaudhuri
Assistant Examiner—Kevin McAndrews
Attorney, Agent, or Firm—Townsend and Townsend

[57] ABSTRACT

The invention comprises an improved bipolar memory device having enhanced protection against the effects of alpha particles comprising at least one memory cell having a buried layer forming at least a portion of the collector of one of the transistors in the memory cell, said buried layer being located sufficiently close to a base layer in only the memory portion of the device to provide a sufficiently high capacitance between said buried layer and said base layer to prevent the occurrence of a soft error caused by an alpha particle striking the structure without interfering with the speed of the device.

20 Claims, 2 Drawing Sheets

SEMICONDUCTOR MEMORY DEVICE HAVING PROTECTION AGAINST ALPHA STRIKE INDUCED ERRORS

This is a continuation of 7,211,179 filed June 24, 1988, which is a continuation of 6,683,288 filed Dec. 18, 1984, now both abandoned.

BACKGROUND OF THE INVENTION

1. Field of the Invention

This invention relates to an integrated circuit memory device protected from soft errors induced by alpha particles.

2. Background Art

Memory cells in integrated circuits, consisting of cross-coupled transistors forming a flip-flop circuit, are subject to soft errors caused by parasitic charges generated by alpha particles striking the integrated circuit structure (alpha strike). Such alpha particles, which may come from the ceramics used in packaging the integrated circuit, generate electron-hole pairs in the incident path of the alpha particles due to their energy loss. These electron-hole pairs may generate a parasitic noise current which may result in turning on the off transistor in the flip-flop circuit of the memory cell to cause a soft error.

It is known that the problem of alpha strike can be reduced or eliminated by reducing the thickness and/or resistivity of the epitaxial silicon layer separating the buried collector layer from the base which effectively raises the collector-base capacitance. Increasing the collector-base capacitance increases the time constant of the memory cell and, therefore, the time required for the flip-flop circuit of the memory cell to invert from one stable state to the other is increased. This increases the immunization of the circuit to parasitic charges generated by alpha particles which tend to be instantaneous.

However, this increased capacitance degrades performance of the integrated circuit structure or chip by slowing down the logic circuit portions due to the increased time constant resulting from the modification to the epitaxial layer.

Kato et al U.S. Pat. No. 4,314,359 addressed this problem by selective heavy doping of an N+ buried collector layer in only the memory portion of an integrated circuit structure with ion-implanted arsenic. This provides auto-doping of a region over the buried layer to effectively reduce the collector-base spacing and thereby increase the collector-base capacitance in only the memory cell area.

However, it is difficult to grow epitaxial silicon over ion-implanted silicon without generating defects in the silicon. Furthermore, out diffusion or autodoping is difficult to control to obtain a precise desired level of capacitance. If the region is under doped, i.e., the out diffusion is not sufficient, the capacitance increase will not be sufficient to obtain the desired increased time constant, and the cell will still be prone to soft errors from alpha particles. On the other hand, if the out diffusion is large some of the dopant may get into the active base region above, increasing the beta of the transistor.

It would, therefore, be desirable to provide an integrated circuit structure wherein the memory cell portion of the circuit was protected from alpha strike without degradation of the performance of the logic portion of the circuit in a manner, which is simple and easily controlled, and which does not cause silicon crystal defects.

SUMMARY OF THE INVENTION

It is therefore an object of the invention to provide an integrated circuit memory structure which is substantially immune to the effects of alpha particles striking the structure.

It is another object of the invention to provide an integrated circuit memory structure which is substantially immune to the effects of alpha particles striking the structure without degradation of the speed of the associated logic circuits in the structure.

It is yet another object of the invention to provide an integrated circuit memory structure which is substantially immune to the effects of alpha particles striking the structure without degradation of the speed of the associated logic circuits in the structure wherein the base-collector capacitance in the memory portion of the integrated circuit structure is selectively increased without increasing the capacitance in the logic portion of the structure.

It is a further object of the invention to selectively protect the memory portion of an integrated circuit structure from the effects of particles striking the structure in a simple and easily controlled manner which will not result in the formation of defects in the silicon crystal and without degrading the performance of the logic portions of the circuit structure by selective removal of at least a portion of the epitaxial layer above the buried layer only in the memory region of the structure to reduce the spacing between the base and the collector of the memory transistor sufficiently to reduce the depletion width an amount which will result in the desired increase in collector-base capacitance.

These and other objects of the invention will be apparent from the following description and accompanying drawings.

DESCRIPTION OF THE PREFERRED EMBODIMENT

The invention provides enhanced immunity to the effects of alpha strike by selective increase of the collector-base capacitance in the memory transistors while retaining conventional collector-base capacitance in the logic transistor. Such an increase in capacitance in the memory portion of the structure only will not substantially affect the speed of the structure as would increased capacitance in the logic portion. Conversely, the effects of alpha strike, by changing the memory state of the memory cell, are much more severe in the memory portion of the structure than in the logic portion. Hence selective protection of the memory portion of the structure from the effects of alpha strike results in an improved bipolar memory cell structure without degradation of the performance of the structure.

Figure 1:
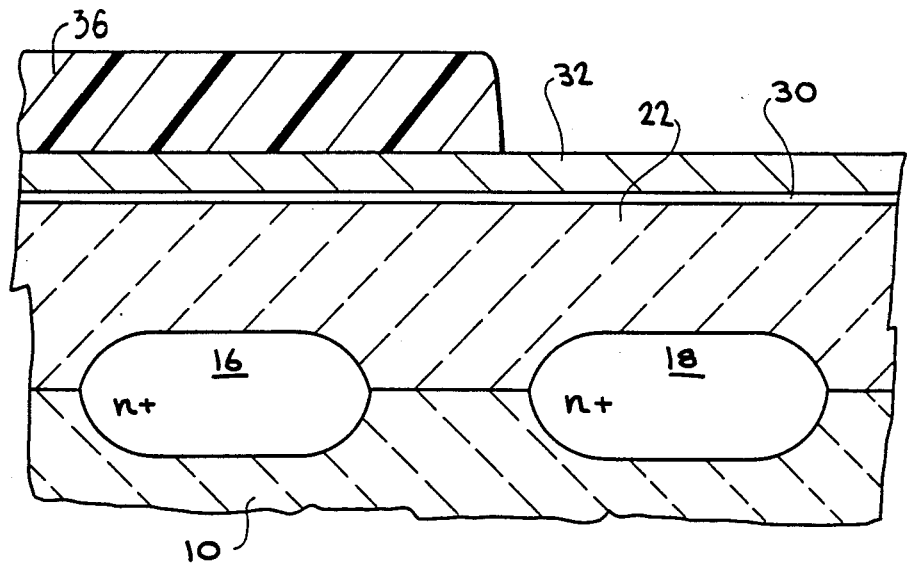
FIG. 1 is a cross-sectional view of a portion of an integrated structure after formation of an N+ buried layer thereon, respectively, for formation of logic and memory transistors thereon.

Referring now to FIG. 1, an integrated structure is shown comprising a P-silicon substrate 10 on which is conventionally formed buried layer portions 16 and 18 which will respectively form the collectors of a logic transistor and a memory transistor. An N epitaxial layer 22 of silicon is then conventionally grown over buried layer portions 16 and 18.

At this point, a dielectric film is formed which preferably comprises growing a thin silicon oxide layer 30 and forming a silicon nitride layer 32 over oxide layer 30 using, for example, ammonia and silane as is well known to those skilled in the art.

In accordance with the invention, the structure is then masked using photoresist 36 to provide an opening only in the memory area as shown in FIG. 1. The nitride and oxide layers are etched away through the mask opening using, for example, a plasma etch or a phosphoric acid wet etch.

After removal of the exposed nitride and oxide layers, and the photoresist layer at least a portion of the epitaxial silicon layer 22 over buried layer portion 18 is removed. As previously stated, the purpose of the removal of at least some of the epitaxial silicon overlying the buried collector layer of the memory transistor is to reduce the depletion width between the collector region, and the base region which will be formed in the epitaxial silicon layer 22, sufficiently to provide the desired capacitance increase. Thus the epitaxial silicon removed is an amount which will leave remaining sufficient epitaxial silicon to permit the formation of a base region having a lower boundary ranging from just above the collector to partially diffused into the collector as will be discussed below. The buried layer to base spacing should not exceed 3 microns, and preferably, not exceed 2 microns.

Figure 2:
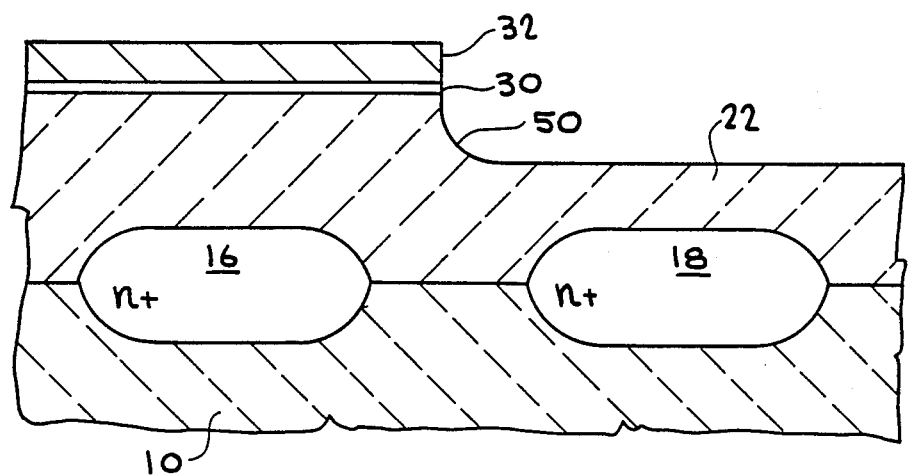
FIG. 2 is a cross-sectional view of the structure of FIG. 1 showing selective removal, by etching, of a portion of the N epitaxial silicon layer overlying the N+ buried layer in the memory region.

The removal of at least some of the exposed epitaxial silicon in layer 22 overlying buried layer portion 18, representing the memory area of the structure, may be accomplished by etching the silicon through the mask. The resulting structure is illustrated in FIG. 2. The epitaxial silicon may be removed with a wet etch, such as chromic trioxide.

Figure 3:
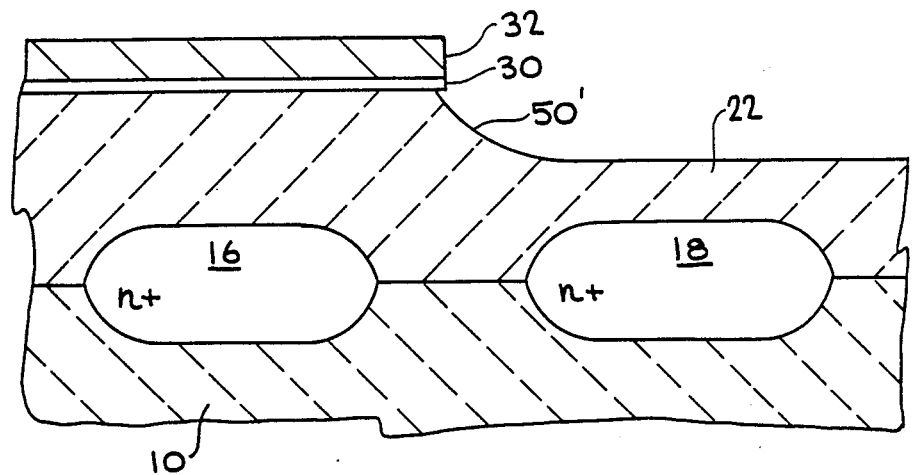
FIG. 3 is a cross-sectional view of the structure of FIG. 1 showing the preferred selective removal, by oxidation and oxide removal, of a portion of the N epitaxial silicon layer overlying the N+ buried layer in the memory region.

However, in a preferred embodiment, as shown in FIG. 3, the silicon is removed in a more precise and controlled manner by oxidizing the silicon and then selectively removing, with a conventional HF oxide etch, only the oxide grown through the mask. In this embodiment, a layer of silicon oxide is grown through the mask and then removed to provide the desired amount of silicon removal. The amount of silicon oxide grown will depend upon the amount of silicon layer 22 which one desires to remove, as previously discussed.

Comparison of the geometry of the remaining structure shown in FIG. 2 at 50 after removal of the epitaxial silicon by etching with that shown in FIG. 3 at 50' after removal of the epitaxial silicon via the oxidation method shows that a smoother step results from the preferred oxide growth and removal form of thinning epitaxial silicon layer 22 in the memory area.

As previously discussed, the actual amount of silicon in layer 22 which is removed in accordance with the practice of invention will vary depending upon the amount of increased capacitance needed to raise the time constant sufficiently to desensitize the memory circuit to instantaneous charges or noise generated from an alpha particle striking the structure. It has been found that removal of all but about 0.3 to 1.5 microns of epitaxial silicon layer 22 is usually adequate to provide the needed capacitance increase.

Figures 4A, 4B:
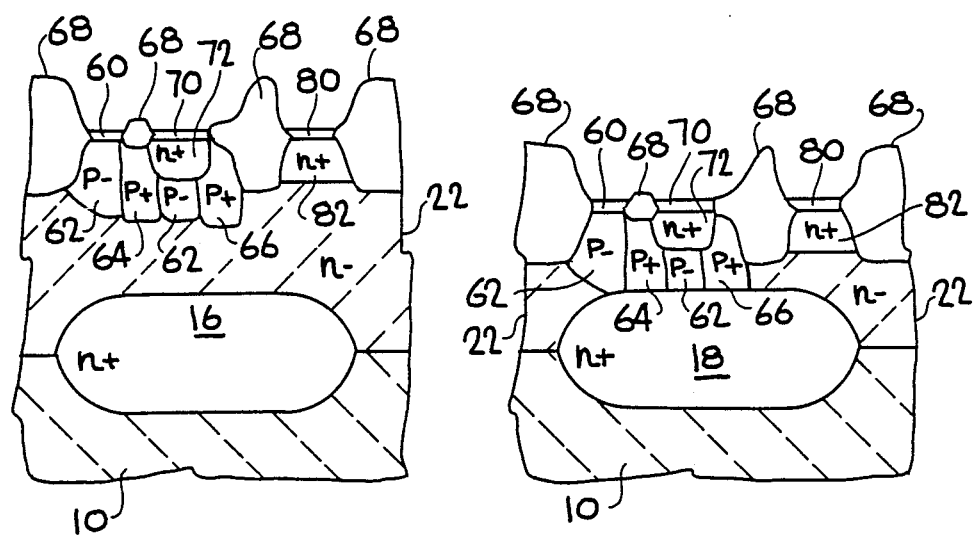
FIG. 4A is a cross-section view of a portion of the structure of FIG. 3 after construction of a logic transistor thereon.
FIG. 4B is a cross-section view of a portion of the structure of FIG. 3 after construction of a memory transistor thereon.

FIGS. 4A and 4B shows the structure of FIG. 3 after construction, respectively, of a logic transistor and a memory transistor. FIG. 4A shows the logic transistor, which is of conventional construction, and comprises a base contact 60 overlying a portion of intrinsic base region 62; an emitter contact 70 overlying an emitter region 72; and a collector contact 80 overlying collector region 82. P+ extrinsic base regions are provided at 64 and 66. Silicon oxide is shown at 68.

FIG. 4B illustrates the memory transistor which, except for its location with respect to buried collector layer 18, may be constructed identically to the logic transistor of FIG. 4A and, thus, is denoted with the same reference numerals.

However, in accordance with the invention, intrinsic base region 62 of the memory transistor in FIG. 4B is not spaced as far from the N+ buried collector layer 18 as is the logic transistor base region 62 in FIG. 4A from its buried collector layer 16. Thus, the collector-base capacitance between memory base 62 and memory collector 18 of the memory transistor in FIG. 4B is increased over the conventional base-collector capacitance which is present in the logic transistor construction. This selective increase in capacitance thus renders the memory portion of the cell more immune from the effects of alpha strike without, however, interfering with the collector-base capacitance of the logic portion of the cell. Thus, the speed of the device is not affected by the modification.

It should be noted here, that while the memory transistor structure shown in FIG. 4B illustrates intrinsic base region 62 as located immediately adjacent buried collector layer 18 with no epitaxial silicon 22 therebetween, it is within the purview of the invention that a thin layer of epitaxial silicon 22 may remain to separate intrinsic base 62 from buried collector 18 provided the layer 22 is thin enough to achieve the desired capacitance increase. It is also within the scope of the invention to permit some overlap, i.e., diffusion of the base region and the buried layer region into one another provided the diffusion overlap is not sufficient to result in an unacceptable increase in the beta of the memory transistor.

To further illustrate the invention, a number of sample parts were constructed and tested, each having 1K memory cells. A first group of 10 parts, denoted as Group A in the table below, were constructed in accordance with the invention with epitaxial silicon removed, in the memory cell areas only, by growing and then removing a 1.5 micron oxide layer over the buried memory collector layer. A second group of 10 parts, denoted as Group B, consisted of 10 parts constructed similarly to Group A except that the thickness of the oxide formed over the buried collector was only 1.0 microns. Group C represents 10 1K parts having a 1.5 micron layer of oxide grown and removed across the entire structure, i.e., in both the memory and logic transistor areas. Group D represents a fourth group of 10 parts constructed using conventional collector-base spacing with no removal of epitaxial silicon between the intrinsic base and the buried collector layer.

Each of the parts in each group was tested on an accelerated basis for about 5-6 minutes using a thorium foil source of alpha particles with a given memory pattern written into each part. At the end of the test period, each cell was read to determine how many cells had changed from 1 to 0 (or 0 to 1) indicating a soft error due to alpha strike. The total elapsed testing time for all the parts in a group was then noted and a failure rate per hour calculated from the elapsed time and the total number of failures in all the parts tested for that group.

The speed of the logic was also measured and recorded as an average for each group to provide a comparison between the conventional prior art construction (Group D); the construction in accordance with the invention (Groups A and B); and the construction of Group C wherein the logic capacitance was also increased. With respect to speed, it will be seen that the structure of the invention is essentially the same as that of the conventional cell. On the other hand, the Group C structures, having increased logic capacitance as well as memory capacitance, were much slower.

With respect to soft error failures, Groups A and B, constructed in accordance with the invention, exhibit a radical improvement over the conventional prior art structures of Group D.

TABLE I

| GROUP | IEE 25° C. (ma) | TIME 25° C. (ns) | TIME 100° C. (ns) | NUMBER OF FAILS | TIME (Minutes) | FAILURE RATE (Fails/Hr) |
|---|---|---|---|---|---|---|
| A | 120 | 8.7 | 8.8 | 1 | 54 | 1.11 |
| B | 123 | 8.9 | 8.9 | 3 | 60 | 3 |
| C | 105 | 11.2 | 12.7 | 0 | 48 | 0 |
| D | 139 | 7.6 | 9.3 | 258 | 54 | 287 |

Thus, the invention provides a novel bipolar memory cell structure having improved resistance to the effects of alpha strike without degradation of performance. The structure can be formed in a simple, yet accurate and easily controlled process and which does not result in silicon crystal defects.

Having thus described the invention, what is claimed is:

1. A method of constructing an improved bipolar integrated circuit device having bipolar memory transistors and bipolar logic transistors comprising the steps of:
    forming first and second buried collector layer regions of a first conductivity type on a silicon substrate;
    forming an epitaxial silicon layer of said first conductivity type over said silicon substrate and first and second buried collector layer regions thereon;
    selectively masking a portion of said epitaxial silicon layer including portions over said first buried collector layer region to expose substantially only portions of said epitaxial silicon over said second buried collector layer region;
    removing at least some of said exposed epitaxial silicon layer;
    simultaneously forming base regions of a second conductivity type in said epitaxial layer over said first buried collector layer region and in said epitaxial layer over said second buried collector layer region; and
    simultaneously forming emitter regions of said first conductivity type in said base regions over said first buried collector layer region and said second buried collector layer region;
    whereby a memory transistor with said second buried collector layer region has increased base-collector capacitance and greater immunity from alpha particle strikes compared to a logic transistor with said first buried collector layer region.

2. A method of constructing an improved bipolar integrated circuit device according to claim 1, wherein said first buried collector layer region forms a part of a bipolar logic transistor and said second buried collector layer region forms a part of a bipolar memory transistor.

3. The method of constructing an improved bipolar integrated circuit device according to claim 1, wherein the spacing between collector and base over said first buried collector layer region is greater than the spacing between collector and base over said second buried collector layer region.

4. A method of constructing an improved bipolar integrated circuit device according to claim 1, wherein the spacing between collector and base over said second buried collector layer region is less than the collector-base depletion width of the structure formed above said first buried collector layer region.

5. A method of constructing an improved bipolar integrated circuit device according to claim 1, wherein said exposed epitaxial silicon layer is removed to a thickness of not greater than 3 microns.

6. A method of constructing an improved bipolar integrated circuit device according to claim 1, wherein removal of at least some of said exposed epitaxial layer is performed by selective growth of oxide over said second buried collector layer region, followed by removal of said oxide.

7. A method of constructing an improved bipolar integrated circuit device having bipolar memory transistors and bipolar logic transistors comprising the steps of:
    forming first and second buried collector layer regions of a first conductivity type on a silicon substrate, said first buried collector layer region for a bipolar logic transistor and said second buried collector layer region for a bipolar memory transistor;
    forming an epitaxial silicon layer of said first conductivity type over said silicon substrate and first and second buried collector layer regions thereon;
    selectively masking a portion of said epitaxial silicon layer including portions over said first buried collector layer region to expose substantially only portions of said epitaxial silicon layer over said second buried collector layer region;
    removing at least some of said exposed epitaxial silicon layer;
    simultaneously forming base regions of a second conductivity type over said first buried collector layer region and over said second buried collector layer region;

simultaneously forming emitter regions of said first conductivity type in said base regions over said first buried collector layer region and said second buried collector layer region;

whereby said memory transistor has increased base-collector capacitance and greater immunity from alpha particle strikes and said logic transistor.

8. A method of constructing an improved bipolar integrated circuit device according to claim 7, wherein the spacing between collector and base in said logic transistor is greater than the spacing between collector and base in said memory transistor.

9. A method of constructing an improved bipolar integrated circuit device according to claim 7, wherein the collector-base spacing of said memory transistor is less than the collector-base depletion width of said logic transistor.

10. A method of constructing an improved bipolar integrated circuit device according to claim 7, wherein the spacing between collector and base of said memory transistor is not greater than 3 micrometers.

11. A method of constructing an improved bipolar integrated circuit device according to claim 7, wherein removal of at least some of said exposed epitaxial silicon layer includes the step of selectively growing oxide overlaying said second buried collector layer region, followed by removal of said oxide.

12. A method of constructing an improved bipolar integrated circuit device having bipolar memory transistors and bipolar logic transistors comprising the steps of:

forming first and second buried collector layer regions of a first conductivity type on a silicon substrate, said first buried collector layer region for a bipolar logic transistor and said second buried collector layer region for a bipolar memory transistor;

forming an epitaxial silicon layer of said first conductivity type over said silicon substrate and first and second buried collector layer regions thereon;

selectively masking a portion of said epitaxial silicon layer including portions over said first buried collector layer region to expose all of said epitaxial silicon layer portions over said second buried collector layer region;

removing at least some of said epitaxial silicon layer;

forming base regions of a second conductivity type over said first buried collector layer region and over said second buried collector layer region; and forming emitter regions of said first conductivity type in said base regions over said first buried collector layer region and said second buried collector layer region;

whereby said first buried collector layer region, said base region, and said emitter region thereover comprise a bipolar logic transistor, said second buried collector layer region, said second base region and said emitter region thereover comprise a memory transistor, said memory transistor having increased base-collector capacitance and greater immunity from alpha particle strikes than said logic transistor.

13. A method of constructing an improved bipolar integrated circuit device according to claim 12, wherein the spacing between collector and base in said logic transistor is greater than the spacing between collector and base in said memory transistor.

14. A method of constructing an improved bipolar integrated circuit device according to claim 12, wherein the collector-base spacing of said memory transistor is less than the collector-base depletion width of said logic transistor.

15. A method of constructing an improved bipolar integrated circuit device according to claim 12, wherein the spacing between collector and base of said memory transistor is not greater than 3 micrometers.

16. A method of constructing an improved bipolar integrated circuit device according to claim 12, wherein removal of at least some of said exposed epitaxial silicon layer includes the step of selectively growing oxide overlaying said second buried collector layer region, followed by removal of said oxide.

17. A method of constructing an improved bipolar integrated circuit device having bipolar memory transistors and bipolar logic transistors comprising the steps of:

forming first and second buried collector layer regions of a first conductivity type on a silicon substrate, said first buried collector layer region for a bipolar logic transistor and said second buried collector layer region for a bipolar memory transistor;

forming an epitaxial silicon layer of said first conductivity type over said silicon substrate and first and second buried collector layer regions thereon;

selectively masking a portion of said epitaxial silicon layer including portions over said first buried collector layer region to expose all of said epitaxial silicon layer portions over said second buried collector layer region;

removing a portion of said exposed epitaxial silicon layer such that the remaining thickness of said exposed epitaxial silicon layer over said second buried collector layer region is less than the thickness of said epitaxial silicon layer over said first buried collector layer region, and further wherein a thickness of said exposed epitaxial silicon layer after removal of a portion of same is not greater than 3 microns;

forming base regions of a second conductivity type over said first buried collector layer region and over said second buried collector layer region; and forming emitter regions of said first conductivity type in said base regions over said first buried collector layer region and said second buried collector layer region;

whereby said first buried collector layer region, said base region and said emitter region thereover comprise a bipolar logic transistor, said second buried collector layer region, said base region and said emitter region thereover comprise a memory transistor, said memory transistor having increased base-collector capacitance and greater immunity from alpha particle strikes than said logic transistor.

18. A method of constructing an improved bipolar integrated circuit device according to claim 17, wherein the step of removing at least some of said exposed epitaxial silicon layer further includes the step of selectively growing an oxide overlying the second buried collector layer region, followed by removal of said oxide.

19. A method of constructing an improved bipolar integrated circuit device having bipolar memory transistors and bipolar logic transistors comprising the steps of:

forming first and second buried collector layer regions of a first conductivity type on a silicon substrate, said first buried collector layer region for a bipolar logic transistor and said second buried collector layer region for a bipolar memory transistor;

forming an epitaxial silicon layer of said first conductivity type over said silicon substrate and first and second buried collector layer regions thereon;

selectively masking a portion of said epitaxial silicon layer including portions over said first buried collector layer region to expose all of said epitaxial silicon layer portions over said second buried collector layer region;

removing at least some of said exposed epitaxial silicon layer by selectively growing an oxide over said second buried collector layer region, followed by removal of said oxide;

forming base regions of a second conductivity type over said first buried collector layer region and over said second buried collector layer region; and forming emitter regions of said first conductivity type in said base regions over said first buried collector layer region and said second buried collector layer region;

whereby said first buried collector layer region, said base region and said emitter region thereover comprise a bipolar logic transistor, said second buried collector layer region, said base region and said emitter region thereover comprise a memory transistor, said memory transistor having increased base-collector capacitance and greater immunity from alpha particle strikes than said logic transistor.

20. A method of constructing an improved bipolar integrated circuit device according to claim 19, wherein the step of removing at least some of said exposed epitaxial silicon layer results in a remaining thickness of said epitaxial silicon layer of not greater than 3 microns.

* * * * *